(12) United States Patent
Saito

(10) Patent No.: US 12,253,458 B2
(45) Date of Patent: Mar. 18, 2025

(54) DRYNESS DETECTION METHOD AND DRYNESS DETECTION APPARATUS

(71) Applicant: DISCO CORPORATION, Tokyo (JP)

(72) Inventor: Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 239 days.

(21) Appl. No.: 18/052,023

(22) Filed: Nov. 2, 2022

(65) Prior Publication Data

US 2023/0296498 A1 Sep. 21, 2023

(30) Foreign Application Priority Data

Nov. 10, 2021 (JP) .................................. 2021-183365

(51) Int. Cl.
*G01N 21/25* (2006.01)
*G01N 21/17* (2006.01)
*G01N 21/84* (2006.01)

(52) U.S. Cl.
CPC ... *G01N 21/255* (2013.01); *G01N 2021/1742* (2013.01); *G01N 2021/1748* (2013.01); *G01N 2021/8472* (2013.01)

(58) Field of Classification Search
CPC .. G01N 33/442; G01N 21/3563; G01N 21/64; G01N 21/33; G01N 21/359; G01N 21/3554; G01N 21/6408; G01N 27/44747; G01N 21/8422; G01N 2291/0251; G01N 21/17; G01N 2203/0092; G01N 2021/3148; G01N 21/31; G01N 21/55; G01N 2201/129; G01N 31/22; G01N 2021/8411; G01N 2021/8427; G01N 21/645; G01N 2021/6417; G01N 2021/6484; G01N 2021/8918; G01N 21/892; G01N 11/142;
(Continued)

(56) References Cited

U.S. PATENT DOCUMENTS

| | | | | |
|---|---|---|---|---|
| 9,211,695 B2* | 12/2015 | Paulson | ............. | B41F 23/0456 |
| 10,468,255 B2* | 11/2019 | Zhao | ................. | B23K 26/0006 |
| 2011/0252871 A1* | 10/2011 | Nagoshi | .............. | G01N 11/142 |
| | | | | 73/847 |

FOREIGN PATENT DOCUMENTS

| | | | | |
|---|---|---|---|---|
| DE | 102009037541 A1 * | 2/2011 | ............ | G01N 21/55 |
| DE | 112014001353 T5 * | 11/2015 | ............ | B05D 3/067 |

(Continued)

*Primary Examiner* — Michael P Stafira
(74) *Attorney, Agent, or Firm* — Greer, Burns & Crain, Ltd.

(57) ABSTRACT

A dryness detection method of detecting dryness of a liquid resin composition containing a solvent. The dryness detection method includes a wavelength selection step of selecting a light absorption wavelength of the solvent, a light source selection step of selecting a light source that emits light including light of the selected wavelength, a light receiving step of applying the light that has been emitted from the light source to the liquid resin composition, and receiving light that has passed through the liquid resin composition, and a determination step of finding whether or not the light of the selected wavelength after absorption in the solvent in the light receiving step exceeds in quantity a predetermined threshold, and if the threshold is found to be exceeded, determining that the solvent has evaporated and the liquid resin composition has dried. A dryness determination apparatus is also disclosed.

20 Claims, 5 Drawing Sheets

(58) Field of Classification Search
CPC ............. G01N 19/04; G01N 2011/008; G01N 2021/4146; G01N 2021/432; G01N 2021/6491; G01N 2021/8438; G01N 2021/845; G01N 2021/8472; G01N 21/278; G01N 21/35; G01N 21/3559; G01N 21/4133; G01N 21/57; G01N 21/6428; G01N 25/02; G01N 33/445; G01N 15/1409; G01N 2015/0853; G01N 2015/1027; G01N 2021/3595; G01N 2021/6439; G01N 2021/8416; G01N 21/272; G01N 21/3103; G01N 21/3581; G01N 21/41; G01N 21/552; G01N 21/59; G01N 21/643; G01N 21/7743; G01N 21/84; G01N 33/44; G01N 11/00; G01N 2011/006; G01N 2021/4711; G01N 2021/8627; G01N 2021/8645; G01N 2030/885; G01N 21/274; G01N 21/314; G01N 21/62; G01N 21/6458; G01N 21/8901; G01N 2201/0221; G01N 2201/061; G01N 2203/0003; G01N 2203/0017; G01N 2203/0019; G01N 2203/0023; G01N 2203/0067; G01N 2203/0078; G01N 2223/643; G01N 2223/645; G01N 23/04; G01N 25/12; G01N 3/08; G01N 3/20; G01N 3/42; G01N 3/56; G01N 3/60; G01N 33/54366; G01N 33/54393; G01N 1/36; G01N 1/42; G01N 2021/1776; G01N 2021/218; G01N 2021/6419; G01N 2021/6421; G01N 2021/6432; G01N 2021/8444; G01N 2021/8663; G01N 2021/8848; G01N 2021/8917; G01N 2021/9511; G01N 21/21; G01N 21/251; G01N 21/3577; G01N 21/43; G01N 21/6445; G01N 21/78; G01N 21/80; G01N 21/86; G01N 21/8806; G01N 21/958; G01N 2201/101; G01N 2201/1296; G01N 2291/011; G01N 2291/015; G01N 2291/0255; G01N 2291/02854; G01N 2291/0423; G01N 2291/102; G01N 27/00; G01N 27/226; G01N 2800/2828; G01N 29/032; G01N 29/11; G01N 29/2462; G01N 29/326; G01N 30/88; G01N 33/32; G01N 35/00613; G01N 7/14

See application file for complete search history.

(56) References Cited

FOREIGN PATENT DOCUMENTS

| EP | 1131619 | B1 | * | 10/2006 | ............. G01N 21/57 |
|----|---------|----|---|---------|--------------------------|
| EP | 3238934 | A1 | * | 11/2017 | ............. B32B 21/06 |
| ES | 2567596 | T3 | * | 4/2016 | ............. G01N 21/35 |
| JP | H0545288 | A | * | 2/1993 | |
| JP | 2004188475 | A | | 7/2004 | |
| JP | 2008225093 | A | * | 9/2008 | |
| JP | 2015065386 | A | * | 4/2015 | |
| JP | 2018157052 | A | * | 10/2018 | |
| KR | 20070093827 | A | * | 9/2007 | |
| WO | WO-0186261 | A1 | * | 11/2001 | ............. G01N 21/31 |
| WO | WO-2018155289 | A1 | * | 8/2018 | ............. G01N 21/27 |
| WO | WO-2019239651 | A1 | * | 12/2019 | |

* cited by examiner

DRYNESS DETECTION METHOD AND DRYNESS DETECTION APPARATUS

BACKGROUND OF THE INVENTION

Field of the Invention

The present invention relates to a dryness detection method of and a dryness detection apparatus for detecting dryness of a liquid resin composition.

Description of the Related Art

A wafer with a plurality of devices such as integrated circuits (ICs) or large scale integration (LSI) formed on a front surface thereof and defined by a plurality of intersecting streets is divided into individual device chips by a dicing apparatus, a laser processing apparatus, or the like, and the divided device chips are used in electronic equipment such as mobile phones or personal computers.

The laser processing apparatus is generally constructed of a chuck table that holds the wafer, a laser beam irradiation unit that applies a laser beam to the wafer held on the chuck table, and a feeding mechanism that performs relative processing feeding of the chuck table and the laser beam irradiation unit, and can process the wafer with high precision.

If dividing grooves are to be formed along the streets through ablation processing by applying a laser beam of a wavelength having absorptivity for the wafer, the front surface of the wafer is covered beforehand with a protective film such that scattering debris is prevented from sticking to surfaces of the devices and lowering their quality (see, for example, JP 2004-188475A).

SUMMARY OF THE INVENTION

If the above-described protective film is formed by covering the front surface of the wafer with a liquid resin composition, the laser beam may, however, be applied to apply processing before the protective film sufficiently dries and hardens. If this is the case, the protective film cannot exhibit its functions, thereby raising a problem that metal films such as test element groups (TEGs) formed on the streets may peel off to lower the quality of the devices. Not only being limited to cases where as described above a protective film is formed with a liquid resin composition on a front surface of a wafer, where devices are formed, but also including a variety of situations where a liquid resin composition is used, there is a need for the avoidance of the above-described problem to surely determine the dryness of such a liquid resin composition because a determination has to be made as to whether or not the liquid resin composition has dried sufficiently.

The present invention therefore has as objects thereof the provision of a dryness determination method and a dryness detection apparatus that can surely determine dryness of a liquid resin composition.

In accordance with a first aspect of the present invention, there is provided a dryness detection method of detecting dryness of a liquid resin composition containing a solvent. The dryness detection method includes a wavelength selection step of selecting a light absorption wavelength of the solvent, a light source selection step of selecting a light source that emits light including light of the selected wavelength, a light receiving step of applying the light that has been emitted from the light source to the liquid resin composition, and receiving light that has passed through the liquid resin composition, and a determination step of finding whether or not the light of the selected wavelength after absorption in the solvent in the light receiving step exceeds in quantity a predetermined threshold, and if the threshold is found to be exceeded, determining that the solvent has evaporated and the liquid resin composition has dried.

Preferably, the threshold may is determined empirically in advance by applying the light that has been emitted from the light source selected in the light source selection step to the liquid resin composition which has dried to a predetermined degree through evaporation of the solvent, receiving light passed through the liquid resin composition and measuring in quantity the light of the selected wavelength included in the received light, and selecting a value smaller than the measured quantity of the light of the selected wavelength. Preferably, the liquid resin composition may be a water-based resin composition, and the solvent may be water. Light to be absorbed in water includes light of 1450 nm wavelength, light of 1940 nm, and light of 2900 nm, and in the light source selection step, a light source that emits the light of one of the wavelengths may be selected.

In accordance with a second aspect of the present invention, there is provided a dryness determination apparatus including a dryness detector that detects dryness of a liquid resin composition. The dryness detector includes a light source that emits light including light of a light absorption wavelength of a solvent contained in the liquid resin composition, a light receiver that receives light that has passed through the liquid resin composition after application of the light that has been emitted from the light source to the liquid resin composition, and a determination section integrated in a controller and configured to find, based on a quantity of the light of the light absorption wavelength included in the light received by the light receiver, whether or not a quantity of the light of the light absorption wavelength after absorption in the solvent exceeds a threshold, and if the threshold is found to be exceeded, determine that the solvent has evaporated and the liquid resin composition has dried.

According to the dryness determination method of the present invention, the dryness of the liquid resin composition can be surely determined. For example, ablation processing can therefore be applied by applying a laser beam to a wafer with the liquid resin composition dried sufficiently. Even if metal films such as TEGs are formed along streets, it is hence possible to solve the problem that the metal films are peeled off by the ablation processing to lower the quality of devices.

According to the dryness determination apparatus of the present invention, the dryness of the liquid resin composition can be surely determined. For example, ablation processing can therefore be applied by applying a laser beam to a wafer with the liquid resin composition dried sufficiently. Even if metal films such as TEGs are formed along streets, it is hence possible to solve the problem that the metal films are peeled off by the ablation processing to lower the quality of devices.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

With reference to FIGS. 1 through 5 of the attached drawings, a description will hereinafter be made in detail regarding a dryness detection method according to a first embodiment of a first aspect of the present invention and a dryness detection apparatus according to a first embodiment of a second aspect of the present invention.

Figure 1A:
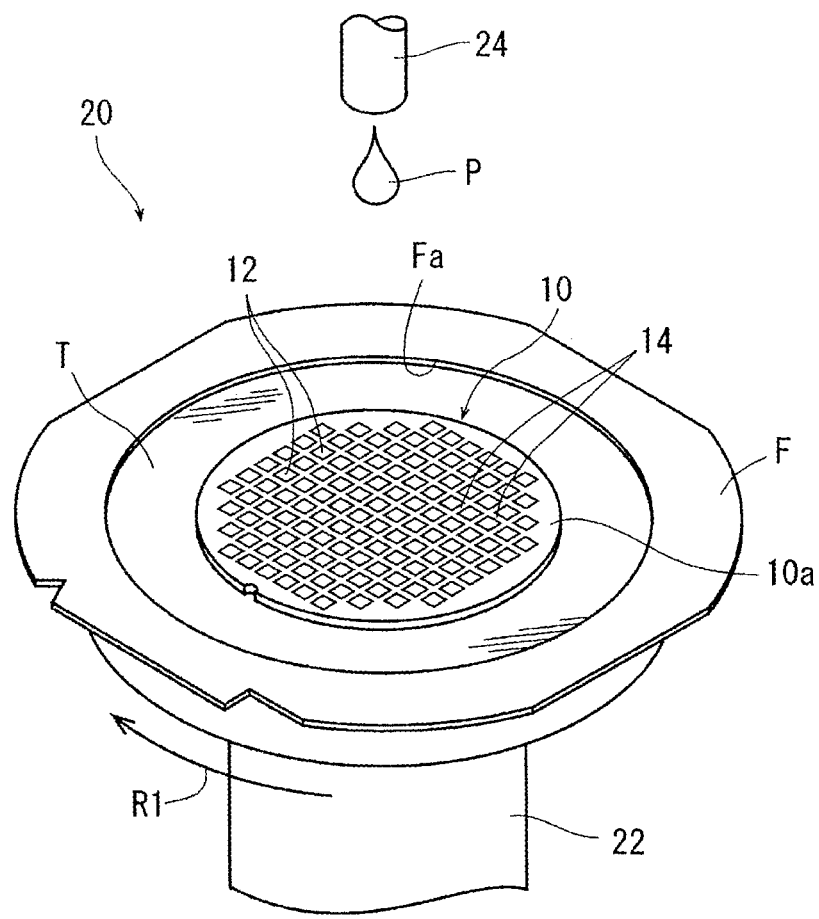
FIG. 1A is a perspective view depicting how a protective film of a liquid resin composition is formed on a wafer to which a dryness detection method and a dryness detection apparatus of the present invention are applied.
Figure 1B:
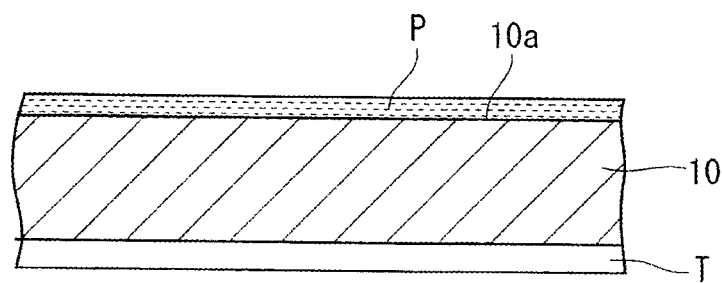
FIG. 1B is an enlarged fragmentary cross-sectional view of the wafer depicted in FIG. 1A.

FIG. 1A is a perspective view depicting how a protective film of a liquid resin composition P is formed on a wafer 10 to which a dryness detection method and a dryness detection apparatus of the present invention are applied, and FIG. 1B is an enlarged fragmentary cross-sectional view of the wafer 10 depicted in FIG. 1A. Described more specifically, FIG. 1A depicts, together with a protective film forming device 20 (depicted in part), the wafer 10 with respect to which the dryness of the liquid resin composition P is to be detected by the dryness detection method of the first embodiment and the dryness detection apparatus 2 of the first embodiment. The wafer 10 is a disk-shaped semiconductor substrate with a plurality of devices 12 formed on a front surface 10a thereof and defined by a plurality of intersecting streets 14. The wafer 10 is held via an adhesive tape T on an annular frame F that includes an opening Fa large enough to accommodate the wafer 10 therein.

On the wafer 10, dividing grooves are to be formed along the streets 14 through ablation processing by a laser beam of a wavelength that has absorptivity for the wafer 10 and that is applied from a laser processing apparatus (not depicted). Before the above-described ablation processing is performed, the front surface 10a of the wafer 10 is covered with the liquid resin composition P such that at the time of the ablation processing to the wafers 10, scattering debris is prevented from sticking to surfaces of the devices 12 and lowering their quality.

The liquid resin composition P is supplied to the front surface 10a of the wafer 10, for example, by the protective film forming device 20 depicted in FIG. 1A. The protective film forming device 20 includes a spinner table 22 and a liquid resin composition feed nozzle 24. The spinner table 22 is configured to be able to hold the above-described wafer 10 under suction and is rotated at a high speed in a direction indicated by an arrow R1 in the figure. The liquid resin composition feed nozzle 24 drops a predetermined amount of the liquid resin composition P downwardly from above a center of the spinner table 22.

The above-described wafer 10 is held under suction on the spinner table 22, the liquid resin composition P is dropped onto the front surface 10a of the wafer 10 from the liquid resin composition feed nozzle 24, and at the same time, the spinner table 22 is rotated at a high speed in the direction indicated by the arrow R1. The liquid resin composition P is, for example, a water-based composition of a water-soluble resin, specifically, polyvinyl alcohol (PVA), and its solvent is water. In association with rotation of the spinner table 22, the liquid resin composition P spreads over the front surface 10a of the wafer 10, whereby a protective film of the liquid resin composition P is formed over the front surface 10a of the wafer 10 as appreciated from the enlarged fragmentary cross-sectional view in FIG. 1B. As the time goes on, water as the solvent evaporates from the protective film of the liquid resin composition P formed on the front surface 10a of the wafer 10, so that the liquid resin composition P dries and hardens. The dryness determination method and a dryness detection apparatus of the embodiments are configured to surely determine whether or not the liquid resin composition P which forms the protective film has become into a dry state suitable for ablation processing by a laser beam.

Figure 2:
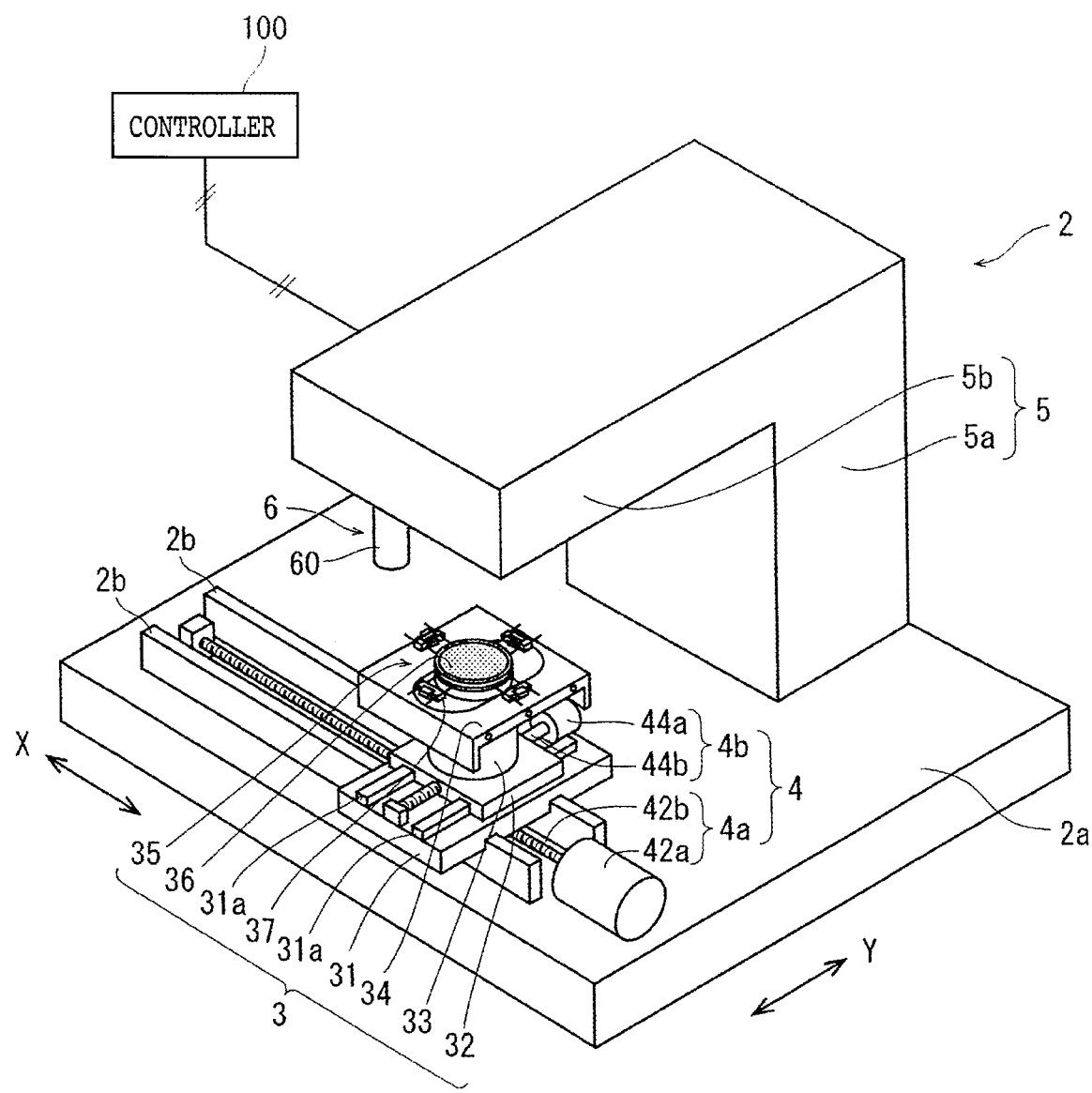
FIG. 2 is an overall perspective view of a dryness detection apparatus according to a first embodiment of a second aspect of the present invention, which is suitable for practicing a dryness detection method according to a first embodiment of a first aspect of the present invention.

FIG. 2 is an overall perspective view of the dryness detection apparatus 2 according to the first embodiment of the second aspect of the present invention, which is suitable for practicing the dryness detection method according to the first embodiment. To detect the degree of dryness of the above-described resin composition P, the wafer 10 is transferred to the dryness detection apparatus 2 depicted in FIG. 2.

The dryness detection apparatus 2 is disposed on a base 2a and includes a holding unit 3 that holds the above-described wafer 10, a moving mechanism 4 that moves the holding unit 3 in an X-axis direction and a Y-axis direction, a dryness detector 6 that detects the dryness of the liquid resin composition P with which the front surface 10a of the wafer 10 held on the holding unit 3 is covered, a frame body 5 formed from a vertical wall portion 5a disposed upright beside the moving mechanism 4 and a horizontal wall portion 5 extending in a horizontal direction from an upper end portion of the vertical wall portion 5a, and a controller 100. The dryness detector 6 includes an optical system which is accommodated inside the horizontal wall portion 5b and is described in detail subsequently.

As depicted in FIG. 2, the holding unit 3 includes a rectangular X-axis direction movable plate 31 mounted movably in the X-axis direction on the base 2a, a rectangular Y-axis direction movable plate 32 mounted movably in the Y-axis direction on the X-axis direction movable plate 31, a cylindrical post 33 fixed on an upper surface of the Y-axis direction movable plate 32, and a square cover plate 34 fixed on an upper end of the post 33. On the cover plate 34, a chuck table 35 is disposed extending upward through an elongated hole formed in the cover plate 34. The chuck table 35 is means for holding the wafer 10 by using, as a holding surface, an XY plane specified by X coordinates and Y-coordinates, and is configured to be rotatable by rotary drive means (not depicted) accommodated in the post 33. Disposed on an upper surface of the chuck table 35 is a suction chuck 36 which is formed from a porous material having air permeability and makes up the holding surface. The suction chuck 36 is connected to suction means (not depicted) via a flow passage extending through the post 33, and four clamps 37 that are mentioned subsequently are disposed at equal intervals on a periphery of the suction chuck 36 to hold the annular frame F when the wafer 10 is hold on the chuck table 35.

The moving mechanism 4 includes an X-axis moving mechanism 4a which moves the above-described chuck table 35 in the X-axis direction and a Y-axis moving mechanism 4b which moves the chuck table 35 in the Y-axis direction. The X-axis moving mechanism 4a converts rotary motion of a motor 42a into linear motion via a ball screw 42b and transmits the linear motion to the X-axis direction movable plate 31, whereby the X-axis direction movable plate 31 is moved in the X-axis direction along a pair of guide rails 2b disposed along the X-axis direction on the base 2a. The Y-axis moving mechanism 4b converts rotary motion of a motor 44a into linear motion via a ball screw 44b and transmits the linear motion to the Y-axis direction movable plate 32, whereby the Y-axis direction movable plate 32 is moved in the Y-axis direction along a pair of guide rails 31a disposed along the Y-axis direction on the X-axis direction movable plate 31.

Figure 3A:
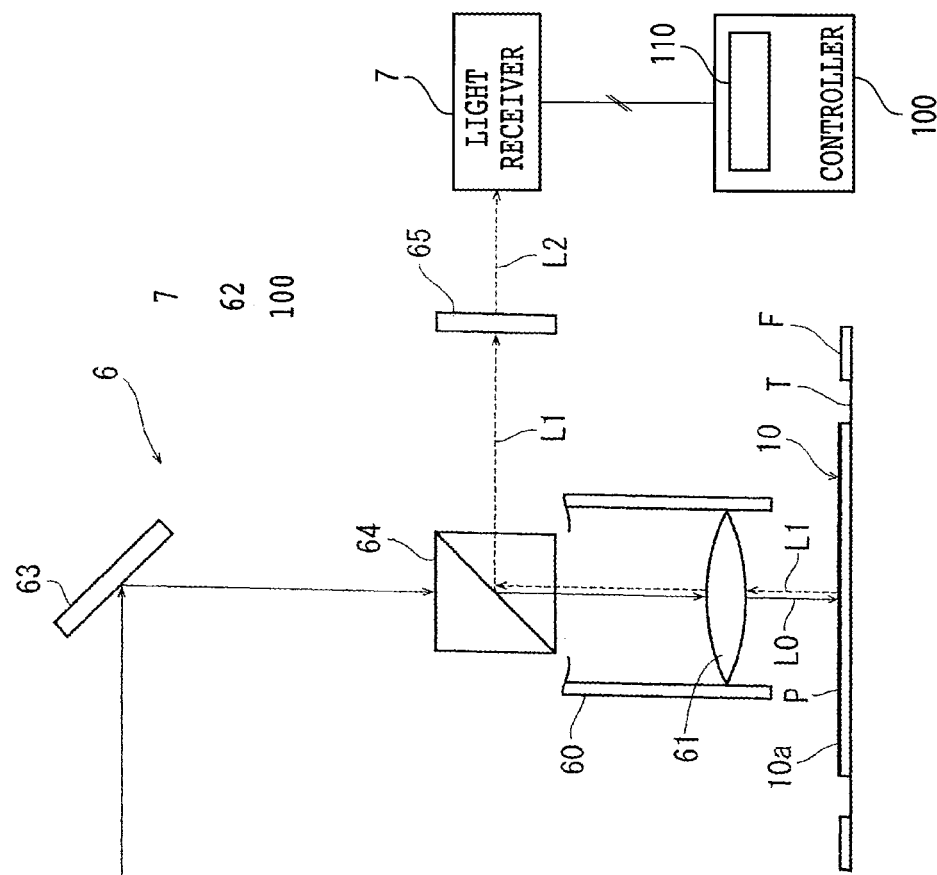
FIG. 3A is a schematic block diagram depicting an optical system of a dryness detector in the dryness detection apparatus depicted in FIG. 2.

FIG. 3A is a schematic block diagram depicting an optical system of the dryness detector 6 in the dryness detection apparatus 2 depicted in FIG. 2. The dryness detector 6 includes at least a light source 62 that emits and applies light L0 and a light receiver 7 that receives light L1 obtained after the light L0 has passed through the liquid resin composition P on the front surface 10a of the wafer 10 after its application to the liquid resin composition P. Further described, the dryness detector 6 also includes a reflection mirror 63, a beam splitter 64, a condenser 60, and a bandpass filter 65. The reflection mirror 63 changes, into an appropriate direction, an optical path of the light L0 applied from the light source 62. The beam splitter 64 allows transmission of the light L0 reflected from the reflection mirror 63. The condenser 60 includes a condenser lens 61 which condenses the light L0 and applies it to the liquid resin composition P on the wafer 10. The bandpass filter 65 allows transmission of only light in a predetermined wavelength range contained in the light L1 after its reflection from the surface 10a of the wafer 10 and its passage through the liquid resin composition P on the wafer 10. The light receiver 7 is configured from a photodetector which receives light L2 obtained after transmission of the light L1 through the bandpass filter 65, and outputs a voltage value (mV) corresponding to the quantity of the light L2. The value of the light quantity detected by the light receiver 7 is sent to and stored in the controller 100.

The controller 100 integrated in the above-described dryness detection apparatus 2 is configured from a computer and includes a central processing unit (CPU) that performs operations according to a control program, a read only memory (ROM) that stores the control program and the like, a random access memory (RAM) that can write and read detection values, operation results, and the like for their temporary storage, an input interface, and an output interface (details are not depicted in the figure). At least the light receiver 7 is connected to the controller 100. The controller 100 includes a determination section 110 which is configured as a control program to determine, based on the quantity of the light L2 received by the light receiver 7, that the liquid resin composition P has dried, and is described in detail subsequently. Although not depicted in the figure, operations of the holding unit 3, the moving mechanism 4, and the like may also be controlled by the controller 100.

The dryness detection apparatus 2 of this embodiment generally has the configuration as described above and with respect to the dryness detection method of this embodiment to be practiced by using the dryness detection apparatus 2, a description is made hereinafter. It is to be noted that the above-described protective film forming device 20 may be disposed inside the dryness detection apparatus 2 depicted in FIG. 2. If this is the case, with the wafer 10 held on the holding unit 3, the liquid resin composition P is supplied to the surface 10a of the wafer 10 to form the above-described protective film.

When the dryness detection method of this embodiment is practiced, a wavelength selection step is first performed to select a light absorption wavelength of the solvent in the liquid resin composition P that is to be supplied to the wafer 10 for the formation of the protective film. Described more specifically, the protective film for the wafer 10 is formed with the liquid resin composition P that contains water as the solvent. Water is known to have a property to absorb light of wavelengths longer than 700 nm, and in particular, to absorb light of 1450 nm wavelength, light of 1940 nm wavelength, and light of 2900 nm wavelength. In the wavelength selection step in the dryness detection method of this embodiment, the wavelength of one of 1450 nm, 1940 nm, or 2900 nm, for example, 1940 nm, is selected as the light absorption wavelength of water as the solvent.

A light source selection step is next performed to select, as the light source 62, a light source that emits light including light of the wavelength (1940 nm) selected in the above-described wavelength selection step. Selected as the light source 62 is a lamp, for example, a quartz tungsten halogen (QTH) lamp, that can emit and apply light including light of the wavelength selected in the above-described wavelength selection step, that is, the light of 1940 nm wavelength. The QTH lamp is a light source that can emit and apply light including light of a wide wavelength range of 350 to 4000 nm, and therefore can be used irrespective of which one of the light absorption wavelength 1450 nm, 1940 nm, or 2900 nm, which water absorbs specifically, is selected.

A light receiving step is next performed to receive light after the application of the light L0 to the liquid resin composition P and its passage through the liquid resin composition P. Described more specifically, the wafer 10 is held by the holding unit 3 of the dryness detection apparatus 2 with the light source 62 selected in the above-described light source selection step and is positioned right below the condenser 60 of the above-described dryness detector 6.

Figure 3B:
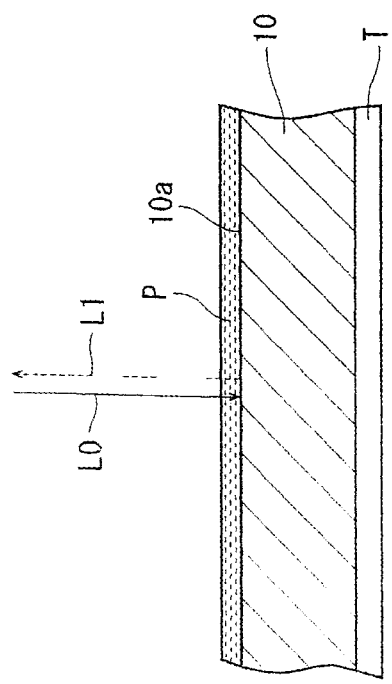
FIG. 3B is an enlarged fragmentary cross-sectional view of the wafer on which a light receiving step in the dryness detection method is being performed.

Here, a description will be made with regard to the light receiving step in the dryness detection method according to this embodiment. FIG. 3B is an enlarged fragmentary cross-sectional view of the wafer 10 on which the light receiving step is being performed. The light source 62 of the dryness detector 6 is next operated to emit and apply the light L0, and after transmission through the above-described beam splitter 64, the light L0 is applied to the liquid resin composition P on the front surface 10a of the wafer 10. As depicted in FIG. 3B, the light L0 applied to the liquid resin composition P passes through the liquid resin composition P, reaches the front surface 10a of the wafer 10 and is reflected there, passes back through the liquid resin composition P, and as the light L1, then reaches the above-described beam splitter 64. The light L1 which has reached the beam splitter 64 is reflected at the beam splitter 64 and is guided toward an optical path on which the light receiver 7 is arranged. As described above, the bandpass filter 65 is arranged between the beam splitter 64 and the light receiver 7. The bandpass filter 65 is a filter that allows transmission of light of the wavelength selected in the above-described wavelength selection step, and in this embodiment, is set to allow transmission of light, for example, in a wavelength range of 1900 to 1980 nm. The light L2 that has transmitted through the bandpass filter 65 reaches the light receiver 7, and a quantity Q of the light L2 detected by the light receiver 7 is transmitted to and stored in the controller 100, whereby the light receiving step is completed. The controller 100 includes the determination section 110 and performs a determination step that, based on a comparison between the quantity Q of the light received by the light receiver 7 and a predetermined threshold Q2, determines whether or not the liquid resin composition P has dried. It is to be noted that the above-described threshold Q2 is determined in advance, for example, by procedures to be described below, and is stored beforehand in the controller 100.

Figure 4:
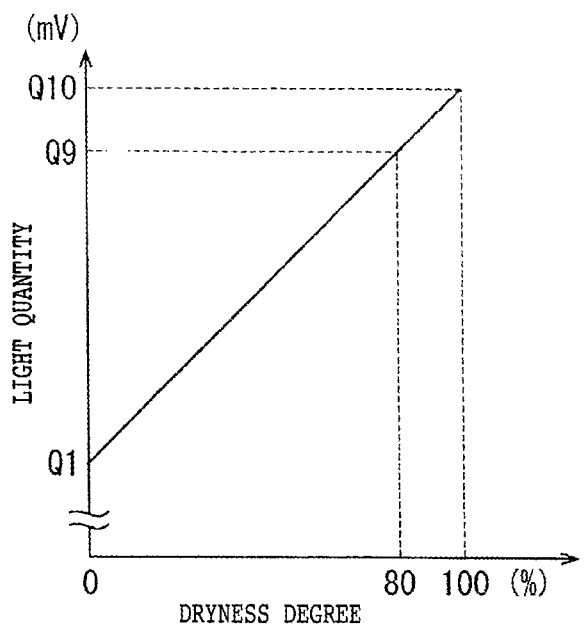
FIG. 4 is a graph depicting a relation between a degree of dryness and quantity of light.

FIG. 4 is a graph depicting a relation between the degree of dryness and the quantity of light. In FIG. 4, the abscissa represents the degree of dryness (%) of the liquid resin composition P, and the ordinate represents the quantity of light (mV) measured by the light receiver 7. As appreciated from the graph of FIG. 4, the above-described quantity of light received by the light receiver 7 is a smallest light quantity Q1 (for example, 1.0 mV) in a state (0%) that the drying of the liquid resin composition P supplied to the wafer 10 has not proceeded at all, because as described above, the water contained as the solvent has the property of absorbing light of 1940 nm wavelength, and the light of 1940 nm wavelength included in the light L0 is absorbed to the maximum in the water as the solvent when it passes through the liquid resin composition P. As the water contained in the liquid resin composition P evaporates and the degree of dryness of the liquid resin composition P proceeds further, the light of 1940 nm wavelength that is absorbed in the liquid resin composition P is progressively attenuated, so that the light quantity Q measured by the light receiver 7 increases with the progress of drying as depicted in FIG. 4. When sufficient time has passed since the supply of the liquid resin composition P to the surface 10a of the wafer 10 and the liquid resin composition P has become into a completely dried state (degree of dryness: 100%), the light of 1940 nm wavelength is no longer absorbed under the action of water in the liquid resin composition P, and therefore the light quantity Q10 (for example, 10.0 mV) is measured as the maximum value. To determine a degree of dryness of the liquid resin composition P at such an extent that would cause no problem when the wafer 10 is subjected to ablation processing, a light quantity Q9, which is smaller than the above-described light quantity Q10 and corresponds, for example, to a dryness degree of 90%, is therefore selected as a threshold Q9 for determining that the liquid resin composition P has dried sufficiently. This threshold Q9 is determined empirically in advance and is stored beforehand in the controller 100.

Figure 5:
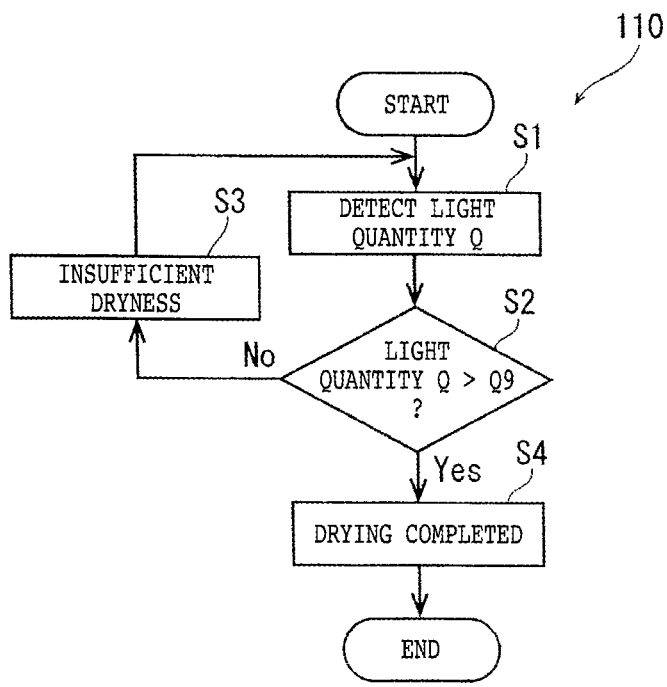
FIG. 5 is a flow chart illustrating a determination step in the dryness detection method.

FIG. 5 is a flow chart illustrating the determination step in the dryness detection method according to the first embodiment. In order to perform the above-described determination step with the above-described threshold Q9 stored in the controller 100, the flow chart illustrated in FIG. 5 is performed by the determination section 110. Described more specifically, in the above-described dryness detection apparatus 2, the light L0 is emitted and applied from the light source 62 of the dryness detector 6 to the liquid resin composition P on the front surface 10a of the wafer 10, and is then allowed to pass through the liquid resin composition P, the above-described light L2 is received by the light receiver 7, and the light quantity Q of the light L2 is then detected by the light receiver 7 (step S1). Next, a determination is made as to whether or not the light quantity Q is greater than the above-described threshold Q9 (step S2). If the light quantity Q is equal to or smaller than the threshold Q9 (No) in step S2, the light of 1940 nm wavelength included in the light L0 has been absorbed, so that its light quantity Q has a small value. The liquid resin composition P is therefore determined to contain lots of water as the solvent, and to be of insufficient dryness (step S3), and the flow returns to step 1. If the light quantity Q is greater than the threshold Q9 (Yes) in step S2, on the other hand, it is determined that water as the solvent has evaporated sufficiently from the liquid resin composition P and the liquid resin composition P has dried to a predetermined level, and the drying is determined to have been completed (step S4). The dryness detection method according to the first embodiment has now been completed.

After the dryness of the liquid resin composition P has been detected by the dryness detection method according to the first embodiment as described above, the wafer 10 is transferred to a laser processing apparatus (not depicted). A laser beam of a wavelength having absorptivity for the wafer 10 is applied to the wafer 10 along the streets 14 from a side of the front surface 10a of the wafer 10 to perform ablation processing, whereby the wafer 10 can be divided into individual device chips.

According to the dryness detection method of the first embodiment and the dryness detection apparatus of the first embodiment, the sufficient dryness of the liquid resin composition P formed as the protective film for the wafer 10 can be surely determined. Ablation processing can therefore be applied by applying a laser beam to the wafer 10 with the liquid resin composition dried sufficiently. Even if metal films such as TEGs are formed along the streets 14, for example, it is hence possible to solve the problem that the metal films may peel off through the ablation processing to lower the quality of the devices. In addition, it is possible to avoid spending unnecessarily long time for drying, and therefore to also make improvements in productivity.

In the above-described dryness detection method of the first embodiment and the above-described dryness detection apparatus of the first embodiment, the description is made with regard to the case in which the solvent of the liquid resin composition P is water. However, the present invention is not limited to a liquid resin composition containing water as a solvent. For example, the solvent contained in the liquid resin composition may be acetone or hexane. If the solvent is acetone, the wavelength range of light which acetone absorbs is 220 to 300 nm. As the light source 62, a deuterium lamp that emits and applies light in a wavelength range of 200 to 400 nm is selected, for example, and a bandpass filter 65 that allows transmission of light in the wavelength range of 220 to 330 nm is arranged. The light emitted and applied from the deuterium lamp includes as a main component thereof the light in the wavelength range which is absorbed in acetone, and therefore the bandpass filter 65 that allows transmission of light only in the wavelength range of 220 to 330 nm can be omitted. If the solvent is hexane, the wavelengths of light which hexane absorbs are 350 nm and 500 nm. As a light source 62, a short arc xenon lamp that emits and applies light in a wavelength range of 250 to 1500 nm can be selected. If this is the case, it is necessary to set the bandpass filter 65 of the above-described dryness detector 6 so as to allow transmission of only light, for example, in a wavelength range of 340 to 360 nm, and to detect by the light receiver 7 the light quantity Q of light L2 passed through the liquid resin composition P.

If the thickness of the protective film to be formed with the liquid resin composition P and/or the concentration and/or kind of the solvent contained in the liquid resin composition P is changed, the light source 62 and the bandpass filter 65 are also changed, and whenever such a change is made, the threshold Q9 to be used in the above-described determination step is also newly calculated empirically according to the above-described procedures, and stored in the controller 100.

Figure 6:
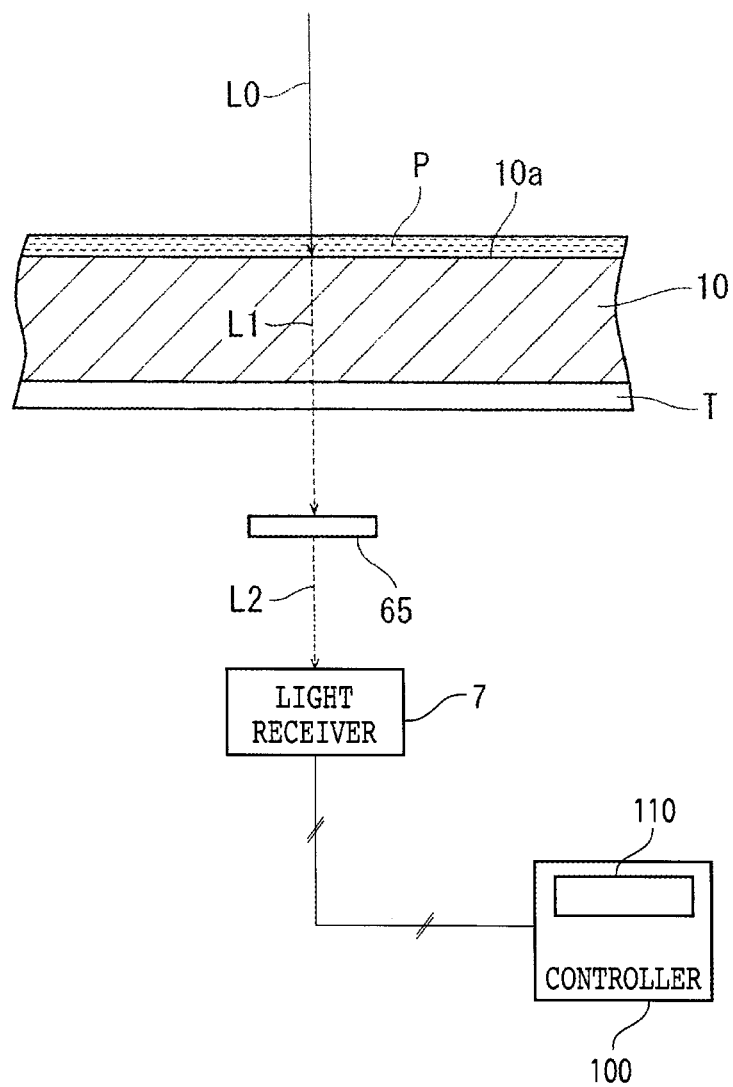
FIG. 6 is a fragmentary block diagram of an optical system of a dryness detector in a dryness detection apparatus according to a second embodiment of the second aspect of the present invention, in which a light receiving step in a dryness detection method according to a second embodiment of the first aspect of the present invention is being performed.

With reference to FIG. 6, a description will hereinafter be made of a dryness detection method according to a second embodiment of the first aspect of the present invention and a dryness detection apparatus according to a second embodiment of the second aspect of the present invention. FIG. 6 is a fragmentary block diagram of an optical system of a dryness detector in the dryness detection apparatus according to the second embodiment, in which a light receiving step in a dryness detection method according to the second embodiment is being performed.

In the above-described dryness detection method according to the first embodiment, the light L1 reflected by applying the light L0 to the front surface 10a of the wafer 10 is used to receive, by the light receiver 7, the light emitted and applied from the light source 62 and passed through the liquid resin composition P. However, the present invention is not limited to the use of the light L1 reflected as described above. If the wafer 10 and the adhesive tape T are formed from materials which allow transmission of the light L0 therethrough, for example, the dryness detector 6 may be modified as depicted in FIG. 6. Described specifically, a dryness detector may be configured such that with an opening (not depicted) formed in the chuck table 35 on which the wafer 10 is held, the above-described bandpass filter 65 and light receiver 7 are arranged on a side of the adhesive tape T on which the wafer 10 is supported, the applied light L0 is allowed to transmit through the liquid resin composition P, the wafer 10, and the adhesive tape T, light L2 is allowed to transmit through the bandpass filter 65, and light L2 is then received by the light receiver 7. In this configuration, however, the setting of the threshold Q9 is somewhat complex because some absorption of light is envisaged to also occur through the wafer 10 and adhesive tape T. The dryness detection method of the first embodiment and the dryness detection apparatus of the first embodiment described above based on FIG. 3 are therefore preferred. The dryness detection apparatus 2 is described as an independent apparatus in the first embodiment described above. However, the present invention is not limited to such an independent dryness detection apparatus, and the dryness detection apparatus 2 may also be incorporated in a laser processing apparatus that applies ablation processing to the wafer 10 by applying a laser beam to the same.

The present invention is not limited to the details of the above-described preferred embodiments. The scope of the invention is defined by the appended claims and all changes and modifications as fall within the equivalence of the scope of the claims are therefore to be embraced by the invention.

What is claimed is:

1. A dryness detection method of detecting dryness of a liquid resin composition containing a solvent, the method comprising:
    a wavelength selection step of selecting a light absorption wavelength of the solvent,
    a light source selection step of selecting a light source that emits light including light of the selected wavelength;
    a light receiving step of applying the light that has been emitted from the light source to the liquid resin composition, and a photodetector receiving light that has passed through the liquid resin composition, and
    a controller performing a determination step of finding whether or not the light of the selected wavelength after absorption in the solvent in the light receiving step exceeds in quantity a predetermined threshold, and if the threshold is found to be exceeded, determining that the solvent has evaporated and the liquid resin composition has dried.

2. The dryness determination method according to claim 1, wherein
    the threshold is determined empirically in advance by applying the light that has been emitted from the light source selected in the light source selection step to the liquid resin composition which has dried to a predetermined degree through evaporation of the solvent, receiving light passed through the liquid resin composition and measuring in quantity the light of the selected wavelength included in the received light, and selecting a value smaller than the measured quantity of the light of the selected wavelength.

3. The dryness determination method according to claim 1, wherein
    the liquid resin composition is a water-based resin composition, and the solvent is water.

4. The dryness determination method according to claim 3, wherein
    light to be absorbed in water includes light of 1450 nm wavelength, light of 1940 nm, and light of 2900 nm, and in the light source selection step, a light source that emits the light of one of the wavelengths is selected.

5. A dryness determination apparatus including a dryness detector that detects dryness of a liquid resin composition, wherein
    the dryness detector includes
    a light source that emits light including light of a light absorption wavelength of a solvent contained in the liquid resin composition,
    a light receiver that receives light that has passed through the liquid resin composition after application of the light that has been emitted from the light source to the liquid resin composition, and
    a determination section integrated in a controller and configured to find, based on a quantity of the light of the light absorption wavelength included in the light received by the light receiver, whether or not a quantity of the light of the light absorption wavelength after absorption in the solvent exceeds a threshold, and if the threshold is found to be exceeded, determine that the solvent has evaporated and the liquid resin composition has dried.

6. The dryness determination apparatus of claim 5 wherein the liquid resin composition is applied to a semiconductor wafer having a plurality of devices formed on a front surface thereof and defined by a plurality of intersecting streets and wherein the wafer is held via an adhesive tape on an annular frame;
    the apparatus further comprising a laser for forming dividing grooves along the streets through ablation processing by a laser beam of a wavelength that has absorptivity for the wafer, the laser beam being applied after it has been determined that the solvent has evaporated and the liquid resin composition has dried.

7. The dryness determination apparatus of claim 6 wherein the wafer comprises metal films formed along the streets.

8. The dryness determination apparatus of claim 6 further comprising a chuck table for holding the semiconductor wafer.

9. The dryness determination apparatus of claim 5 wherein the liquid resin composition is a water-based composition of a water-soluble resin and its solvent is water.

10. The dryness determination apparatus of claim 9 wherein the liquid resin composition comprises polyvinyl alcohol (PVA).

11. The dryness determination apparatus of claim 5 wherein the light source is a quartz tungsten halogen (QTH) lamp that emits light including light of having a 1940 nm wavelength.

12. The dryness determination apparatus of claim 11 further comprising a bandpass filter that only allows transmission of light in a wavelength range of 1900 to 1980 nm to reach the light receiver.

13. The dryness determination apparatus of claim 5 wherein the liquid resin composition comprises acetone.

14. The dryness determination apparatus of claim 13 wherein the light source is a deuterium lamp that emits light in a wavelength range of 200 to 400 nm, and the apparatus further comprises a bandpass filter that only allows transmission of light in the wavelength range of 220 to 330 nm to reach the light receiver.

15. The dryness determination apparatus of claim 5 wherein the liquid resin composition comprises hexane.

16. The dryness determination apparatus of claim 15 wherein the light source is a short arc xenon lamp that emits light in a wavelength range of 250 to 1500 nm, and the apparatus further comprises a bandpass filter that only allows transmission of light in the wavelength range of 340 to 360 nm to reach the light receiver.

17. The dryness determination apparatus of claim 5 further comprising a bandpass filter that allows transmission of light of the light absorption wavelength and wherein
   the light receiver receives light that has passed through the liquid resin composition and the bandpass filter after application of the light that has been emitted from the light source to the liquid resin composition.

18. The dryness determination method according to claim 1, wherein the action of receiving light comprises receiving light that has passed through the liquid resin composition and a bandpass filter that allows transmission of light of the selected wavelength.

19. The dryness determination method according to claim 1, wherein the liquid resin composition comprises acetone;
   the selected light source is a deuterium lamp that emits light in a wavelength range of 200 to 400 nm, and
   the method further comprising filtering light so that only light in the wavelength range of 220 to 330 nm is received in the light receiving step.

20. The dryness determination method according to claim 1, wherein the liquid resin composition comprises hexane;
   the selected light source is a short arc xenon lamp that emits light in a wavelength range of 250 to 1500 nm, and
   the method further comprising filtering light so that only light in the wavelength range of 340 to 360 nm is received in the light receiving step.

* * * * *